United States Patent
Rau et al.

(10) Patent No.: US 8,786,078 B1
(45) Date of Patent: Jul. 22, 2014

(54) VEHICLES, POWER ELECTRONICS MODULES AND COOLING APPARATUSES WITH SINGLE-PHASE AND TWO-PHASE SURFACE ENHANCEMENT FEATURES

(71) Applicants: Toyota Motor Engineering & Manufacturing North America, Inc., Erlanger, KY (US); Purdue Research Foundation, West Lafayette, IN (US)

(72) Inventors: Matthew Joseph Rau, Lafayette, IN (US); Ercan Mehmet Dede, Ann Arbor, MI (US); Shailesh N. Joshi, Ann Arbor, MI (US); Suresh V. Garimella, West Lafayette, IN (US)

(73) Assignees: Toyota Motor Engineering & Manufacturing North America, Inc., Erlanger, KY (US); Purdue Research Foundation, West Lafayette, IN (US)

( * ) Notice: Subject to any disclaimer, the term of this patent is extended or adjusted under 35 U.S.C. 154(b) by 0 days.

(21) Appl. No.: 14/143,377

(22) Filed: Dec. 30, 2013

Related U.S. Application Data

(63) Continuation of application No. 13/734,710, filed on Jan. 4, 2013, now Pat. No. 8,643,173.

(51) Int. Cl.
*H01L 23/34* (2006.01)
(52) U.S. Cl.
USPC ........ 257/714; 257/E23.1; 257/776; 165/80.4
(58) Field of Classification Search
CPC .................................................... H01L 23/473
USPC ............... 257/E23.1, E23.079, E23.093, 619, 257/714, 774–776; 438/280, 619; 361/699–703, 718; 165/80.4, 80.5, 165/104.33, 908
See application file for complete search history.

(56) References Cited

U.S. PATENT DOCUMENTS

| 4,201,195 A | 5/1980 | Sakhuja |
| 4,322,737 A | 3/1982 | Sliwa, Jr. et al. |

(Continued)

FOREIGN PATENT DOCUMENTS

| JP | 10121110 | 5/1998 |
| WO | 98/44307 | 10/1998 |

OTHER PUBLICATIONS

Amon, Cristina H., S. C. Yao, C.F. Wu, and C. C. Hsieh. "Microelectromechanical System-Based Evaporative Thermal Management of High Heat Flux Electronics." Journal of Heat Transfer, 2005:66-75.

(Continued)

*Primary Examiner* — Chris Chu
(74) *Attorney, Agent, or Firm* — Dinsmore & Shohl LLP

(57) ABSTRACT

Jet-impingement, two-phase cooling apparatuses and power electronics modules having a target surface with single- and two-phase surface enhancement features are disclosed. In one embodiment, a cooling apparatus includes a jet plate surface and a target layer. The jet plate surface includes a jet orifice having a jet orifice geometry, wherein the jet orifice is configured to generate an impingement jet of a coolant fluid. The target layer has a target surface, single-phase surface enhancement features, and two-phase surface enhancement features. The target surface is configured to receive the impingement jet, and the single-phase surface enhancement features and the two-phase enhancement features are arranged on the target surface according to the jet orifice geometry. The single-phase surface enhancement features are positioned on the target surface at regions associated with high fluid velocity, and the two-phase surface enhancement features are positioned on the target surface at regions associated with low fluid velocity.

20 Claims, 5 Drawing Sheets

(56) References Cited

U.S. PATENT DOCUMENTS

| | | | |
|---|---|---|---|
| 4,392,153 A | 7/1983 | Glascock, II et al. |
| 4,420,739 A | 12/1983 | Herren |
| 4,494,171 A | 1/1985 | Bland et al. |
| 4,583,582 A | 4/1986 | Grossman |
| 4,733,293 A | 3/1988 | Gabuzda |
| 4,748,495 A | 5/1988 | Kucharek |
| 4,783,721 A | 11/1988 | Yamamoto et al. |
| 4,868,712 A | 9/1989 | Woodman |
| 4,920,574 A | 4/1990 | Yamamoto et al. |
| 4,956,746 A | 9/1990 | Gates, Jr. et al. |
| 5,016,138 A | 5/1991 | Woodman |
| 5,023,695 A | 6/1991 | Umezawa et al. |
| 5,067,047 A | 11/1991 | Azar |
| 5,079,619 A | 1/1992 | Davidson |
| 5,088,005 A | 2/1992 | Ciaccio |
| 5,119,175 A | 6/1992 | Long et al. |
| 5,145,001 A | 9/1992 | Valenzuela |
| 5,210,440 A | 5/1993 | Long |
| 5,228,502 A | 7/1993 | Chu et al. |
| 5,260,850 A | 11/1993 | Sherwood et al. |
| 5,269,372 A | 12/1993 | Chu et al. |
| 5,270,572 A | 12/1993 | Nakajima et al. |
| 5,310,440 A | 5/1994 | Zingher |
| 5,316,075 A | 5/1994 | Quon et al. |
| 5,365,400 A | 11/1994 | Ashiwake et al. |
| 5,394,299 A | 2/1995 | Chu et al. |
| 5,402,004 A | 3/1995 | Ozmat |
| 5,546,274 A | 8/1996 | Davidson |
| 5,548,907 A | 8/1996 | Gourdine |
| 5,912,800 A | 6/1999 | Sammakia et al. |
| 5,959,351 A | 9/1999 | Sasaki et al. |
| 5,978,220 A | 11/1999 | Frey et al. |
| 5,983,997 A | 11/1999 | Hou |
| 5,992,159 A * | 11/1999 | Edwards et al. ................ 62/64 |
| 6,058,010 A | 5/2000 | Schmidt et al. |
| 6,084,771 A | 7/2000 | Ranchy et al. |
| 6,108,201 A * | 8/2000 | Tilton et al. .................. 361/689 |
| 6,123,145 A | 9/2000 | Glezer et al. |
| 6,152,215 A | 11/2000 | Niggemann |
| 6,167,948 B1 | 1/2001 | Thomas |
| 6,167,952 B1 | 1/2001 | Downing |
| 6,242,075 B1 | 6/2001 | Chao et al. |
| 6,305,463 B1 | 10/2001 | Salmonson |
| 6,333,853 B2 | 12/2001 | O'Leary et al. |
| 6,349,554 B2 | 2/2002 | Patel et al. |
| 6,377,461 B1 | 4/2002 | Ozmat et al. |
| 6,386,278 B1 | 5/2002 | Schulz-Harder |
| 6,431,260 B1 | 8/2002 | Agonafer et al. |
| 6,459,581 B1 | 10/2002 | Newton et al. |
| 6,501,654 B2 | 12/2002 | O'Connor et al. |
| 6,571,569 B1 * | 6/2003 | Rini et al. .................... 62/259.2 |
| 6,580,609 B2 | 6/2003 | Pautsch |
| 6,609,560 B2 | 8/2003 | Cho et al. |
| 6,665,185 B1 | 12/2003 | Kulik et al. |
| 6,817,196 B2 * | 11/2004 | Malone et al. ................. 62/171 |
| 6,828,675 B2 | 12/2004 | Memory et al. |
| 6,903,931 B2 | 6/2005 | McCordic et al. |
| 6,942,018 B2 | 9/2005 | Goodson et al. |
| 6,952,346 B2 | 10/2005 | Tilton et al. |
| 6,972,365 B2 | 12/2005 | Garner |
| 6,986,382 B2 | 1/2006 | Upadhya et al. |
| 6,988,535 B2 | 1/2006 | Upadhya et al. |
| 6,992,382 B2 | 1/2006 | Chrysler et al. |
| 6,994,151 B2 | 2/2006 | Zhou et al. |
| 7,009,842 B2 | 3/2006 | Tilton et al. |
| 7,017,654 B2 | 3/2006 | Kenny et al. |
| 7,035,104 B2 | 4/2006 | Meyer |
| 7,058,101 B2 | 6/2006 | Treusch et al. |
| 7,071,408 B2 | 7/2006 | Garner |
| 7,104,312 B2 | 9/2006 | Goodson et al. |
| 7,114,550 B2 | 10/2006 | Nakahama et al. |
| 7,119,284 B2 | 10/2006 | Bel et al. |
| 7,184,269 B2 | 2/2007 | Campbell et al. |
| 7,188,662 B2 | 3/2007 | Brewer et al. |
| 7,204,303 B2 | 4/2007 | Thomas et al. |
| 7,205,653 B2 | 4/2007 | Brandenburg et al. |
| 7,206,203 B2 | 4/2007 | Campbell et al. |
| 7,212,409 B1 | 5/2007 | Belady et al. |
| 7,233,494 B2 | 6/2007 | Campbell et al. |
| 7,250,674 B2 | 7/2007 | Inoue |
| 7,277,283 B2 | 10/2007 | Campbell et al. |
| 7,295,440 B2 | 11/2007 | Ganev et al. |
| 7,298,617 B2 | 11/2007 | Campbell et al. |
| 7,298,618 B2 | 11/2007 | Campbell et al. |
| 7,301,772 B2 | 11/2007 | Tilton et al. |
| 7,302,998 B2 | 12/2007 | Valenzuela |
| 7,327,570 B2 | 2/2008 | Belady |
| 7,336,486 B2 * | 2/2008 | Mongia ........................ 361/695 |
| 7,336,493 B2 | 2/2008 | Berkenbush et al. |
| 7,355,277 B2 | 4/2008 | Myers et al. |
| 7,365,981 B2 | 4/2008 | Myers et al. |
| 7,375,962 B2 | 5/2008 | Campbell et al. |
| 7,385,817 B2 | 6/2008 | Campbell et al. |
| 7,393,226 B2 | 7/2008 | Clayton et al. |
| 7,397,662 B2 | 7/2008 | Oyamada |
| 7,400,504 B2 | 7/2008 | Campbell et al. |
| 7,414,843 B2 | 8/2008 | Joshi et al. |
| 7,414,844 B2 | 8/2008 | Wilson et al. |
| 7,429,792 B2 | 9/2008 | Lee et al. |
| 7,435,623 B2 | 10/2008 | Chrysler et al. |
| 7,450,378 B2 | 11/2008 | Nelson et al. |
| 7,486,514 B2 | 2/2009 | Campbell et al. |
| 7,495,916 B2 | 2/2009 | Shiao et al. |
| 7,511,957 B2 * | 3/2009 | Campbell et al. ............. 361/699 |
| 7,514,046 B2 | 4/2009 | Kechagia et al. |
| 7,516,776 B2 | 4/2009 | Bezama et al. |
| 7,530,778 B2 | 5/2009 | Yassour et al. |
| 7,551,439 B2 | 6/2009 | Peugh et al. |
| 7,571,618 B2 | 8/2009 | Dessiatoun |
| 7,597,135 B2 | 10/2009 | Ghosh et al. |
| 7,599,184 B2 | 10/2009 | Upadhya et al. |
| 7,608,924 B2 | 10/2009 | Myers et al. |
| 7,639,030 B2 | 12/2009 | Wadell |
| 7,679,911 B2 | 3/2010 | Rapp |
| 7,738,249 B2 | 6/2010 | Chan et al. |
| 7,762,314 B2 | 7/2010 | Campbell et al. |
| 7,795,726 B2 | 9/2010 | Myers et al. |
| 7,808,780 B2 | 10/2010 | Brunschwiler et al. |
| 7,830,664 B2 | 11/2010 | Campbell et al. |
| 7,835,151 B2 | 11/2010 | Olesen |
| 7,836,694 B2 | 11/2010 | Arnold |
| 7,839,642 B2 | 11/2010 | Martin |
| 7,841,843 B2 | 11/2010 | Cho et al. |
| 7,885,074 B2 | 2/2011 | Campbell et al. |
| 7,916,483 B2 | 3/2011 | Campbell et al. |
| 7,921,664 B2 | 4/2011 | Rini et al. |
| 7,940,526 B2 | 5/2011 | Schulz-Harder et al. |
| 7,942,997 B2 | 5/2011 | Rivas et al. |
| 7,952,875 B2 | 5/2011 | Woody et al. |
| 7,992,627 B2 | 8/2011 | Bezama et al. |
| 8,037,927 B2 | 10/2011 | Schuette |
| 8,059,405 B2 | 11/2011 | Campbell et al. |
| 8,074,706 B2 | 12/2011 | Su et al. |
| 8,077,460 B1 | 12/2011 | Dede et al. |
| 8,081,461 B2 | 12/2011 | Campbell et al. |
| 8,118,084 B2 | 2/2012 | Harvey |
| 8,194,406 B2 | 6/2012 | Campbell et al. |
| 8,199,505 B2 | 6/2012 | Dede |
| 8,243,451 B2 | 8/2012 | Dede et al. |
| 8,266,802 B2 | 9/2012 | Campbell et al. |
| 2001/0002541 A1 * | 6/2001 | Patel et al. .................... 62/259.2 |
| 2002/0053726 A1 | 5/2002 | Mikubo et al. |
| 2002/0079088 A1 | 6/2002 | Agonafer et al. |
| 2003/0150599 A1 | 8/2003 | Suzuki |
| 2003/0155434 A1 * | 8/2003 | Rini et al. ..................... 239/398 |
| 2003/0196451 A1 | 10/2003 | Goldman et al. |
| 2004/0206477 A1 | 10/2004 | Kenny et al. |
| 2005/0041393 A1 | 2/2005 | Tustaniwskyi et al. |
| 2005/0121180 A1 | 6/2005 | Marsala |
| 2005/0168947 A1 | 8/2005 | Mok et al. |
| 2005/0199372 A1 | 9/2005 | Frazer et al. |
| 2005/0225938 A1 | 10/2005 | Montgomery et al. |
| 2005/0230085 A1 | 10/2005 | Valenzuela |
| 2006/0002086 A1 | 1/2006 | Teneketges et al. |

(56) References Cited

U.S. PATENT DOCUMENTS

| | | |
|---|---|---|
| 2006/0002087 A1 | 1/2006 | Bezama et al. |
| 2006/0144565 A1 | 7/2006 | Tsai et al. |
| 2006/0162365 A1 | 7/2006 | Hoang et al. |
| 2006/0266498 A1 | 11/2006 | Liu et al. |
| 2006/0291164 A1 | 12/2006 | Myers et al. |
| 2007/0034360 A1 | 2/2007 | Hall |
| 2007/0041160 A1 | 2/2007 | Kehret et al. |
| 2007/0074856 A1 | 4/2007 | Bhatti et al. |
| 2007/0084587 A1 | 4/2007 | Huang et al. |
| 2007/0114656 A1 | 5/2007 | Brandenburg et al. |
| 2007/0119565 A1 | 5/2007 | Brunschwiler et al. |
| 2007/0177352 A1 | 8/2007 | Monfarad et al. |
| 2007/0188991 A1 | 8/2007 | Wilson et al. |
| 2007/0221364 A1 | 9/2007 | Lai et al. |
| 2007/0230127 A1 | 10/2007 | Peugh et al. |
| 2007/0236883 A1 | 10/2007 | Ruiz |
| 2007/0272392 A1 | 11/2007 | Ghosh et al. |
| 2007/0274045 A1 | 11/2007 | Campbell et al. |
| 2007/0295480 A1 | 12/2007 | Campbell et al. |
| 2008/0093053 A1 | 4/2008 | Song et al. |
| 2008/0169087 A1 | 7/2008 | Downing |
| 2008/0245506 A1 | 10/2008 | Campbell et al. |
| 2008/0264604 A1 | 10/2008 | Campbell et al. |
| 2009/0032937 A1 | 2/2009 | Mann et al. |
| 2009/0090490 A1 | 4/2009 | Yoshida et al. |
| 2009/0108439 A1 | 4/2009 | Brandenburg et al. |
| 2009/0213546 A1 | 8/2009 | Hassani et al. |
| 2009/0294106 A1 | 12/2009 | Flotta et al. |
| 2010/0000766 A1 | 1/2010 | Loiselet et al. |
| 2010/0038774 A1 | 2/2010 | Zhang et al. |
| 2010/0044018 A1 | 2/2010 | Furberg et al. |
| 2010/0097760 A1 | 4/2010 | Azar et al. |
| 2010/0134996 A1 | 6/2010 | Loiselet |
| 2010/0142150 A1* | 6/2010 | Campbell et al. ............. 361/702 |
| 2010/0242178 A1 | 9/2010 | Goetting |
| 2010/0246117 A1 | 9/2010 | Brunschwiler et al. |
| 2010/0277868 A1 | 11/2010 | Beaupre et al. |
| 2011/0141690 A1 | 6/2011 | Le et al. |
| 2011/0146955 A1 | 6/2011 | Chen |
| 2011/0216502 A1 | 9/2011 | Dede |
| 2012/0048515 A1 | 3/2012 | Bhunia et al. |
| 2012/0063091 A1 | 3/2012 | Dede et al. |
| 2012/0097368 A1 | 4/2012 | Chen et al. |
| 2012/0168145 A1 | 7/2012 | Peterson et al. |
| 2012/0170222 A1 | 7/2012 | Dede |
| 2012/0181005 A1 | 7/2012 | Downing |
| 2012/0212907 A1 | 8/2012 | Dede |
| 2012/0257354 A1 | 10/2012 | Dede |
| 2013/0020059 A1 | 1/2013 | Park |

OTHER PUBLICATIONS

Brignoni, L., Garimella, S., "Performance Characteristics of Confined Impinging Air Jets with Surface Enhancement," Advances in Electronic Packaging, vol. 26-2, 1999: 2009-2014.

Brunschwiler, T., H. Rothuizen, M. Fabbri, U. Kloter, B. Michel, R.J. Benzama, and G. Natarajan, "Direct Liquid Jet-Impingnnent Cooling With Micron-Sized Nozzle Array and Distributed Return Architecture"; Proc. of the Tenth Intersociety Conference on Thermal and Thermomechanical Phenomena in Electronics Systems, San Diego, CA, 2006: 196-203.

Ei-Sheikh, H., Garimella, S., "Heat Transfer from Pin-Fin Heat Sinks under Multiple Impinging Jets," IEEE Transactions on Advanced Packaging, vol. 23-1, 2000: 113-120.

Http://academiccommons.columbia.edu/catalog/ac%3A131465; "Micro-Evaporator Design and Investigation of Phase Change in Tailored Microchannels"; Selin Arslan; Graduate School of Arts and Sciences, Columbia University, 2011.

Http://www.sciencedirect.com/science/article/pii/S0017931098003378; "An experimental study of slot jet impingement cooling on concave surface: effects of nozzle configuration and curvature", 1998.

https://engineering.purdue.edu/CTRC/research/projects/A__JetImpingement_oneslider2011.pdf; "Two-Phase Liquid Jet Impingement Cooling"; S. V. Garimella, D.A. West; Purdue University, Cooling Technologies Research Center, 1991.

Lay, J. H., and V.K. Dhir. "Nucleate Boiling Heat Flux Enhancement on Macro/Micro-Structured Surfaces Cooled by an Impinging Jet." Journal of Enhanced Heat Transfer, 1995: 177-88.

Sung, M. K., Mudawar, I., "Single-phase and two-phase cooling using hybrid micro-channel/slot-jet module." Int. J. of Heat and Mass Transfer, 51, 2008: 3825-3839.

http://digitalcommons.mcmaster.ca/cgi/viewcontent.cgi?article=7365&context=opendissertations; "Effect of surface finish on boiling heat transfer at stagnation point under free liquid jet impingement", 2011.

Skuriat, Robert, Optimum Cooling Solutions for Power Electronics, Nottingham University, Jul. 4, 2008.

Wadsworth, D.C., Mudawar, I., Cooling of a Multichip Electronic Module by Means of Confined Two-Dimensional Jets of Dielectric Liquid, Journal of Heat Transfer, Nov. 1990, vol. 112.

Arslan, Selin, "Micro-Evaporator Design and Investigation of Phase Change in Tailored Microchannels", Columbia University, 2011.

Z. Q. Chen et al., "An experimental study of two phase flow and boiling heat transfer in bi-dispersed porous channels," available at http://www.me.ust.hk/~mezhao/pdf/49.PDF, 2000.

Palm et al., "Enhancement of Boiling Heat transfer by Application of a Porous Layer," available at: http://www.energy.kth.se/index.asp?pnr=10&ID=125&lang=0, 1997-2013.

Zhao, Zenghui, "Enhanced heat transfer with jet impingement on structured-porous surfaces," available at http://ieeexplore.ieee.org/xpl/login.jsp?tp=&arnumber=6231577&url=http%3A%2F%2Fieeexplore.ieee.org%2Fxpls%2Fabs_all.jsp%3Farnumber%3D6231577, 2012.

J. P. Li, et al., Porous Ti6Al4V scaffold directly fabricating by rapid prototyping: Preparation and in vitro experiment; Science Direct; Biomaterials 27 (2006) 1223-1235.

U.S. Appl. No. 13/683,660, filed Nov. 21, 2012, titled: "Cooling Apparatuses Having Sloped Vapor Outlet Channels".

* cited by examiner

VEHICLES, POWER ELECTRONICS MODULES AND COOLING APPARATUSES WITH SINGLE-PHASE AND TWO-PHASE SURFACE ENHANCEMENT FEATURES

CROSS-REFERENCE TO RELATED APPLICATIONS

This application is a continuation of U.S. patent application Ser. No. 13/734,710 entitled "Cooling Apparatuses and Power Electronics Modules with Single-phase and Two-phase Surface Enhancement Features," filed Jan. 4, 2013.

TECHNICAL FIELD

The present specification generally relates to cooling apparatuses for cooling heat generating devices and, more particularly, to jet impingement, two-phase cooling apparatuses having single- and two-phase surface enhancement features.

BACKGROUND

Heat generating devices, such as power semiconductor devices, may be coupled to a heat spreader to remove heat and lower the maximum operating temperature of the heat generating device. In some applications, cooling fluid may be used to receive heat generated by the heat generating device by convective thermal transfer, and remove such heat from the heat generating device. For example, jet impingement may be used to cool a heat generating device by directing impingement jets of coolant fluid onto the heat generating device or a target surface that is thermally coupled to the heat generating device. Additionally, jet impingement may also be combined with two-phase cooling, where the heat generating device is cooled by the phase change of the coolant fluid from a liquid to a vapor.

The coolant fluid flowing on the target surface may have regions of high fluid velocity, and regions of low fluid velocity. Coolant fluid flowing in the regions of high fluid velocity may not change phase to a vapor, but rather provide single-phase heat transfer, while coolant fluid flowing in the regions of low fluid velocity tends to boil and change to a vapor.

Accordingly, a need exists for alternative jet impingement, two-phase cooling apparatuses that take advantage of the high fluid velocity regions and the low fluid velocity regions of coolant flowing on a target surface after impingement.

SUMMARY

In one embodiment, a cooling apparatus includes a jet plate surface and a target layer. The jet plate surface includes a jet orifice having a jet orifice geometry, wherein the jet orifice generates an impingement jet of a coolant fluid. The target layer has a target surface, single-phase surface enhancement features, and two-phase surface enhancement features. The target surface is configured to receive the impingement jet, and the single-phase surface enhancement features and the two-phase enhancement features are arranged on the target surface according to the jet orifice geometry.

In another embodiment, a cooling apparatus includes a jet plate surface and a target layer. The jet plate surface includes a jet orifice that is configured to generate an impingement jet of a coolant fluid. The target layer includes a target surface, single-phase surface enhancement features, and two-phase surface enhancement features. The jet plate surface is offset from the target surface such that the target surface is configured to receive the impingement jet. The jet orifice has a geometry such that when the impingement jet impinges the target surface, a flow pattern of the coolant fluid is produced that is parallel to the target surface. The flow pattern includes regions of high fluid velocity and regions of low fluid velocity. The single-phase surface enhancement features are located at the regions of high fluid velocity, and the two-phase surface enhancement features are located at the regions of low fluid velocity.

In yet another embodiment, a power electronics module includes a jet plate surface, a target layer, and a semiconductor device thermally coupled to the heat transfer surface. The jet plate surface includes a jet orifice having a jet orifice geometry, wherein the jet orifice is configured to generate an impingement jet of a coolant fluid. The target layer includes a target surface, a heat transfer surface, single-phase surface enhancement features, and two-phase surface enhancement features. The target surface is configured to receive the impingement jet, and the single-phase surface enhancement features and the two-phase enhancement features are arranged on the target surface according to the jet orifice geometry.

These and additional features provided by the embodiments described herein will be more fully understood in view of the following detailed description, in conjunction with the drawings.

BRIEF DESCRIPTION OF THE DRAWINGS

The embodiments set forth in the drawings are illustrative and exemplary in nature and not intended to limit the subject matter defined by the claims. The following detailed description of the illustrative embodiments can be understood when read in conjunction with the following drawings, where like structure is indicated with like reference numerals and in which:

DETAILED DESCRIPTION

Embodiments of the present disclosure are directed to jet impingement, two-phase cooling apparatuses that may be utilized to cool heat generating devices, such as semiconductor devices. Jet impingement cooling is provided by directing jets of coolant fluid at an impingement region of a target surface, which may be a heat generating device or a thermally conductive surface coupled to the heat generating device. Heat is transferred to the coolant fluid. In two-phase heat transfer systems, the coolant fluid changes phase from a fluid to a vapor, thereby removing heat flux from the heat generating device. Embodiments described herein employ both single-phase and two-phase surface enhancement features that are arranged on a target surface according to a shape of a jet orifice that produces an impingement jet that strikes the target surface at an impingement region. More particularly, jet orifices of different shapes produce different flow patterns of coolant fluid. The flow patterns have regions of high fluid velocity where the coolant fluid flows relatively fast, and regions of low fluid velocity where the coolant fluid flows relatively slowly (i.e., slower than the regions of high fluid velocity). Two-phase heat transfer in the form of nucleate boiling of the coolant fluid may be more efficient at the regions of low fluid velocity (i.e., non-dominant flow regions), while single-phase heat transfer in the form of convection between the target layer and the coolant fluid may occur at the regions of high fluid velocity (i.e., dominant flow regions) with little nucleate boiling.

In embodiments of the present disclosure, single-phase surface enhancement features in the form of thermally conductive fins are strategically provided on the target surface at the regions of high fluid velocity to increase the surface area of the target surface, thereby increasing heat transfer from the target surface to the coolant fluid. In the regions of low fluid velocity, two-phase surface enhancement features are strategically placed to provide enhanced nucleate boiling surfaces for encouraging two-phase heat transfer. In this manner, embodiments include a target surface that provides for both single-phase and two-phase heat transfer on a single surface. The single-phase and two-phase surface enhancement features are arranged on the target surface according to the shape of the jet orifice to provide for optimum single-phase and two-phase heat transfer. Various embodiments of cooling apparatuses having single-phase and two-phase surface enhancement features on a target surface according to a shape of a jet orifice are described herein below.

Figure 1:
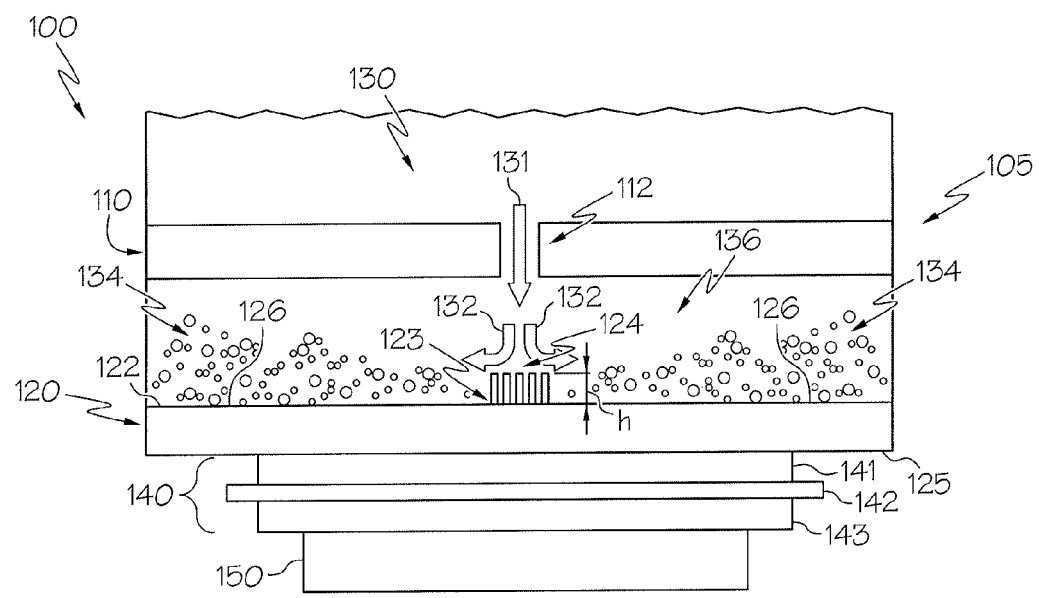
FIG. 1 schematically depicts a power electronics module comprising a jet orifice and a target surface with single-phase surface enhancement features and two-phase surface enhancement features according to one or more embodiments described and illustrated herein.

Referring now to FIG. 1, a power electronics module 100 comprising a cooling apparatus 105 coupled to a substrate assembly 140 and a semiconductor device 150 is schematically illustrated. Semiconductor devices may include, but are not limited to, insulated gate bipolar transistors (IGBT), metal-oxide-semiconductor field effect transistors (MOSFET), power diodes, power bipolar transistors, power thyristor devices, and the like. As an example and not a limitation, the semiconductor device may be included in a power electronic module as a component in an inverter and/or converter circuit used to electrically power high load devices, such as electric motors in electrified vehicles (e.g., hybrid vehicles, plug-in hybrid electric vehicles, plug-in electric vehicles, and the like). The cooling apparatuses described herein may also be used to cool heat generating devices other than semiconductor devices (e.g., mechanical devices, such as motors).

In the illustrated embodiment, the semiconductor device 150 is thermally coupled to an intermediate substrate assembly 140. The illustrated substrate assembly 140 comprises an insulating dielectric layer 142 disposed between two metal layers 141, 143. The substrate assembly 140 may comprise a direct bonded substrate assembly, such as a direct bonded copper assembly or a direct bonded aluminum assembly. Exemplary materials for the insulating dielectric layer 142 include, but are not limited to, alumina, aluminum nitride, silicon nitride, silicon carbide, and beryllium oxide. In alternative embodiments, only one metal layer may be provided. In yet other embodiments, the semiconductor device 150 is directly bonded the cooling apparatus (e.g., at a heat transfer surface 125 of the target layer 120).

The exemplary cooling apparatus 105 generally comprises a jet channel 130, a jet plate 110, and a target layer 120 that is offset from the jet plate 110. The jet plate 110 has at least one jet orifice 112. Coolant fluid (e.g., deionized fluid or an engineered fluid) flows into the jet channel 130 (e.g., via a fluid inlet (not shown)) and enters the jet orifice 112, as indicated by arrow 131. The coolant fluid flows through the jet orifice 112 as an impingement jet that impinges a target surface 122 of the target layer 120 at an impingement region 123. The target layer 120 is fabricated from a thermally conductive material, such as copper or aluminum, for example, and has a target surface 122 that receives the coolant fluid, and a heat transfer surface 125 that is coupled to either the substrate assembly 140 or the semiconductor device 150.

The impingement region 123 may be positioned at a hot spot created by the heat flux generated by the semiconductor device 150. After impinging the target surface 122, the coolant fluid changes direction from being normal to the target surface 122 to flowing parallel to the target surface 122 within an impingement chamber 136, as indicated by arrows 132. The coolant fluid flows across the target surface 122 in a flow pattern defined by regions of different fluid velocities. Heat generated by the semiconductor device 150 is transferred from the target layer 120 to the coolant fluid. In regions of relatively slow fluid flow, some of the coolant fluid will change phase from a liquid to a vapor by nucleation boiling, as indicated by vapor bubbles 134. In regions of dominant, fast fluid flow, much of the heat removal is by convection. The coolant fluid may be removed from the cooling apparatus 105 by outlet ports (not shown) located at the sides of the cooling apparatus 105, or at a top surface of the cooling apparatus 105.

The flow pattern is defined by the shape of the jet orifice 112. For example, a jet orifice 112 having a particular shape or geometry will produce a corresponding flow pattern, while a jet orifice 112 having a different shape or geometry from the aforementioned shape or geometry will produce a different flow pattern from the aforementioned flow pattern. The shape of the jet orifice 112 may depend on the temperature profile on the target surface 122 that is generated by the semiconductor device 150. The jet orifice 112 may take on a variety of shapes, including, but not limited to, cross-shaped (see FIG. 3), star-shaped, lobed-shaped (see FIG. 5), and helical.

Single-phase and two-phase surface enhancement features are provided on the target surface 122 to enhance both single-phase heat transfer and two phase heat transfer, respectively. As shown in FIG. 1 and described in more detail below, single-phase surface enhancement features 124 in the form of thermally conductive fins having a height h are positioned on the target surface 122 at regions associated with high fluid velocity (i.e., dominant fluid flow regions), and two-phase surface enhancement features 126 are positioned on the target surface 122 at regions associated with low fluid velocity (i.e., non-dominant fluid flow regions). The fluid flow velocity may be defined by the fluid flow rate, for example. The two-phase surface enhancement features 126 may be any surface features that increase the number of nucleation sites to promote boiling of the coolant fluid. Two-phase surface enhancement features 126 include, but are not limited to, a roughened target surface 122 (e.g., by laser damage, by chemical etching, by grinding, etc.), a thermally conductive film layer having micro- and/or nano-features that is applied to the target surface 122, micro- or nano-features fabricated into the target surface 122 (e.g., by lithography and chemical etching, laser fabrication, etc.), and a porous area (e.g., a porous coating) of the target surface 122. For example, the two-phase surface enhancement features 126 may be defined by micro-pillars that provide additional surface area to encourage nucleation. However, it should be understood that any surface that encourages nucleation may be used for the two-phase surface enhancement features 126.

Figure 2:
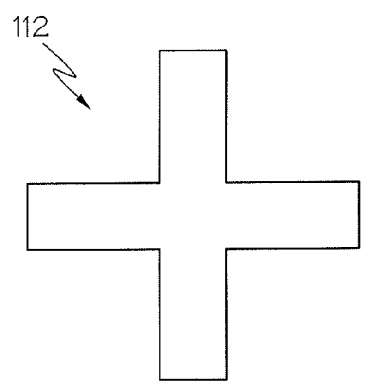
FIG. 2 schematically depicts a cross-shaped jet orifice according to one or more embodiments described and illustrated herein.
Figure 3:
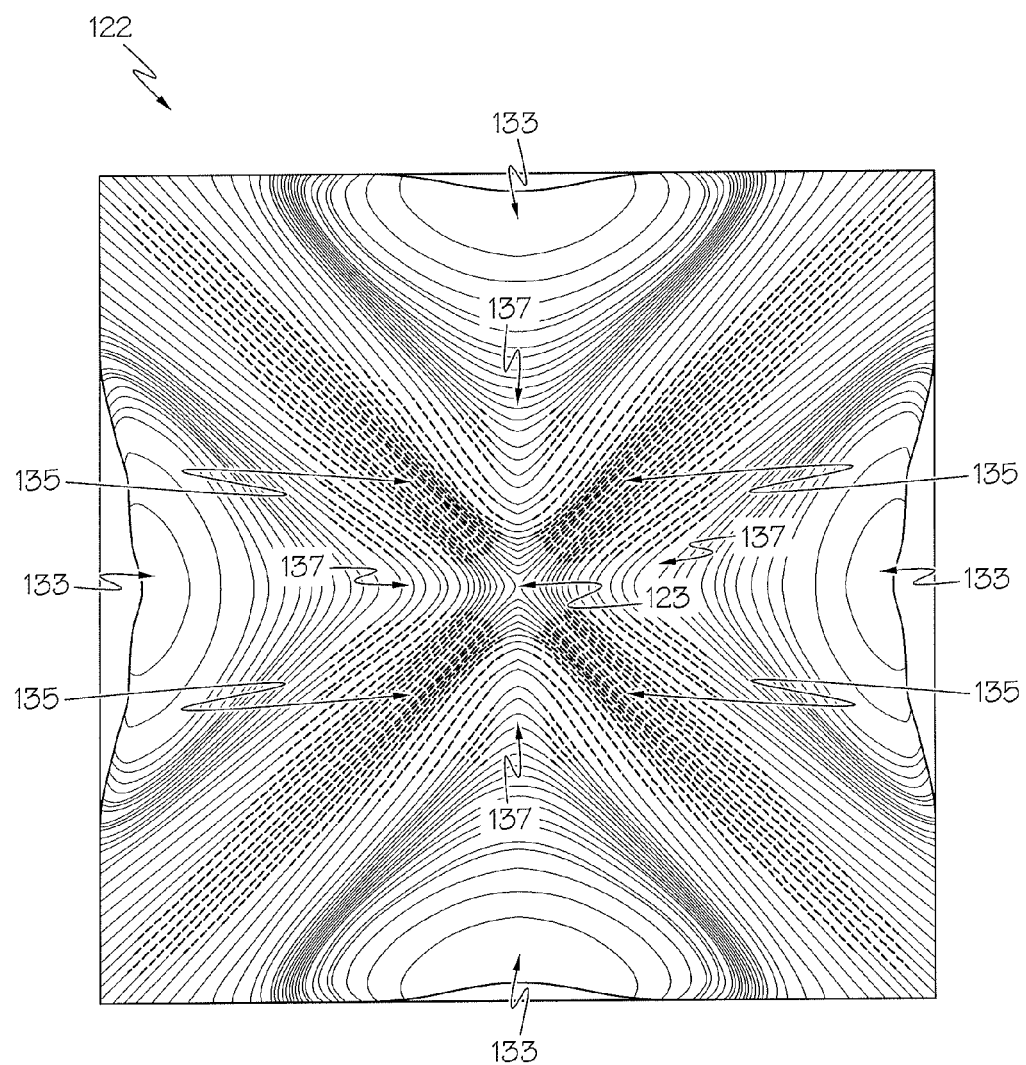
FIG. 3 schematically depicts a flow pattern of coolant fluid on a target surface corresponding to the jet orifice depicted in FIG. 2 according to one or more embodiments described and illustrated herein.

As described above, the jet orifice 112 may have a particular jet orifice geometry that produces a particular flow pattern on the target surface 122. FIG. 2 schematically depicts a cross-shaped jet orifice, while FIG. 3 schematically depicts fluid flow streamlines illustrating a computed flow pattern associated with the jet orifice depicted in FIG. 2. It should be understood that the cross-shaped jet orifice 112 and the flow pattern depicted in FIGS. 2 and 3 are for illustrative purposes only, and that other jet orifice geometries and resulting flow patterns are possible.

The impingement jet of coolant fluid strikes the impingement region 123 in a cross-shaped pattern having arm regions 137. As shown in FIG. 3, regions of high fluid velocity 135 radially extend from the center of the impingement region 123. The dashed fluid flow streamlines in the regions of high fluid velocity 135 represent high fluid velocity, while the solid fluid lines represent slower fluid velocity. The regions of high fluid velocity 135 in the illustrative flow pattern are at forty-five degree angles with respect to the cross-shaped jet orifice 112. The coolant fluid within the regions of high fluid velocity 135 represent the dominant fluid flow on the target surface 122. The coolant fluid flowing parallel to the jet orifice 112 within the arm regions 137 from the impingement region 123 has a fluid velocity that is lower than the coolant fluid flowing at an angle with respect to the arm regions 137. The coolant fluid flowing parallel to the jet orifice within the arm regions 137 flow into regions of low fluid velocity 133 and represent a non-dominant fluid flow on the target surface 122.

The regions of high fluid velocity 135 may be created by the coolant fluid impinging the target surface in a cross-shaped impingement jet, where coolant fluid from the arms of the impingement jet are forced outwardly upon impingement on the target surface 122, and is combined into high velocity fluid flows that are at a forty-five degree angle with respect to the cross-shaped impingement jet flowing through the cross-shaped jet orifice 112.

Figure 4:
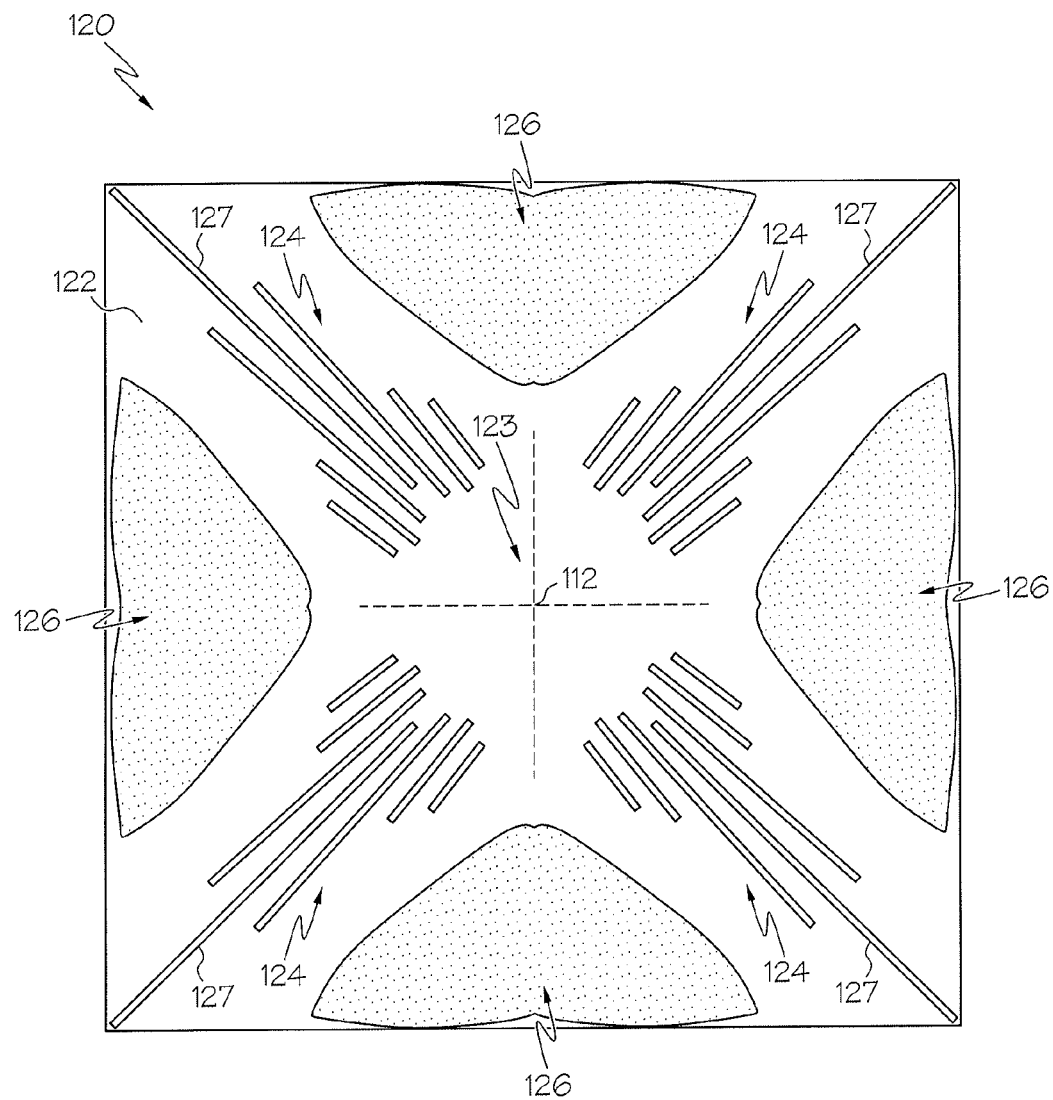
FIG. 4 schematically depicts a target surface having single-phase surface enhancement features and two-phase surface enhancement features arranged according to the flow pattern depicted in FIG. 3 according to one or more embodiments described and illustrated herein.

As stated above, embodiments of the present disclosure comprise a target surface 122 having strategically positioned single-phase surface enhancement features and two-phase surface enhancement features. Referring now to FIG. 4, a target surface 122 of a target layer 120 is schematically depicted. Single-phase surface enhancement features 124 are located at the regions of high fluid velocity 135, and two-phase surface enhancement features 126 are located at the regions of low fluid velocity 133. As shown in FIG. 4, the single-phase surface enhancement features 124 are configured as thermally conductive fins that radially extend from the impingement region 123. The jet orifice 112 is depicted in dashed lines for reference. The thermally conductive fins may be integral to the target surface 122 of the target layer 120, or discrete components that are bonded or otherwise coupled to the target surface 122. The single-phase surface enhancement features 124 increase the surface area of the target surface 122 that the coolant fluid is in contact with, thereby enhancing thermal transfer from the target surface 122 to the coolant fluid by convection.

In the illustrated embodiment, the single-phase surface enhancement features 124 are arranged in four groups that correspond to the four regions of high fluid velocity 135 depicted in FIG. 3. The single-phase surface enhancement features 124 within each group may be optimally shaped and arranged to optimize coolant fluid flow and convection. In the non-limiting illustrated example, a center single-phase surface enhancement feature (or center thermally conductive fin 127) of each group may be configured as the longest thermally conductive fin, with each thermally conductive fin being shorter than the previous thermally conductive fin in directions away from the center thermally conductive fin 127. In this manner, the single-phase surface enhancement features 124 may be arranged to match the shape of the regions of high fluid velocity 135 depicted in FIG. 3. However, it should be understood that embodiments are not limited to the arrangement of single-phase surface enhancement features 124 depicted in FIG. 4, and that other arrangements are also possible.

Similarly, the two-phase surface enhancement features 126 are arranged at the regions of low fluid velocity 133 of the coolant fluid as shown in FIG. 3. The two-phase surface enhancement features 126 may be any micro- or nano-scale features that act as nucleation site enhancements to promote nucleation of the coolant fluid. As an example and not a limitation, the two-phase surface enhancement features 126 may be provided by roughening the target surface 122 such that the area of the two-phase surface enhancement features 126 has a surface roughness (measured in root-mean-squared ("RMS")) that is greater than the surface roughness of areas of the target surface that are outside of the area of the two-phase surface enhancement features 126. In the illustrated embodiment, the two-phase surface enhancement features 126 are located near the perimeter of the target surface 122.

Because the outflow of the coolant fluid is not strong in the regions of low fluid velocity 133, nucleate boiling occurs at these areas of the target surface 122. The two-phase surface enhancement features 126 are configured such that nucleate boiling is enhanced compared to a smoother surface. Therefore, two-phase heat transfer is promoted at the regions of low fluid velocity 133 by the two-phase surface enhancement features 126.

In some embodiments, two-phase surface enhancement features may also be provided at the impingement region 123 because the heat flux being removed from the target layer 120 may be highest at the impingement region 123. The two-phase surface enhancement features may promote nucleate boiling at the impingement region 123 even though the velocity of the coolant fluid may be greater at the impingement region 123 than the other regions of low fluid velocity 133 because of the high temperature of the target surface 122.

In the illustrated embodiment, the groups of single-phase surface enhancement features 124 and the two-phase surface enhancement features 126 alternate about the impingement region 123 such that single-phase surface enhancement features 124 and the two-phase surface enhancement features 126 are symmetrical about more than one axis. As stated above, the arrangement of the single-phase and two-phase surface enhancement features 124, 126 correspond to the shape of the flow pattern, which corresponds to the shape of the jet orifice 112. In this manner, embodiments of the present disclosure encourage both single- and two-phase heat transfer on a single surface by the use of surface enhancement features.

The target surface 122 and surface enhancement features may be designed by first evaluating a temperature profile of the target surface 122 and the semiconductor device 150 (or other heat generating device). A desirable jet orifice 112 geometry may be designed by experimentally or computationally obtaining single-phase heat transfer results associated with a variety of jet orifice geometries. The geometry providing the best single-phase heat transfer results may be selected as the geometry for the jet orifice 112. The flow pattern of the coolant fluid resulting from the jet orifice 112 having the selected geometry (e.g., the flow pattern depicted in FIG. 3 resulting from the jet orifice 112 depicted in FIG. 2) may be evaluated such that the single-phase surface enhancement features 124 and the two-phase surface enhancement features 126 may be designed to complement to jet orifice geometry to maximize the cooling capabilities of the cooling apparatus 105.

Figure 5:
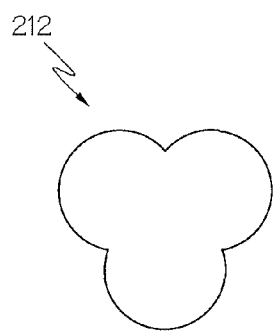
FIG. 5 schematically depicts a three-lobed jet orifice according to one or more embodiments described and illustrated herein.
Figure 6:
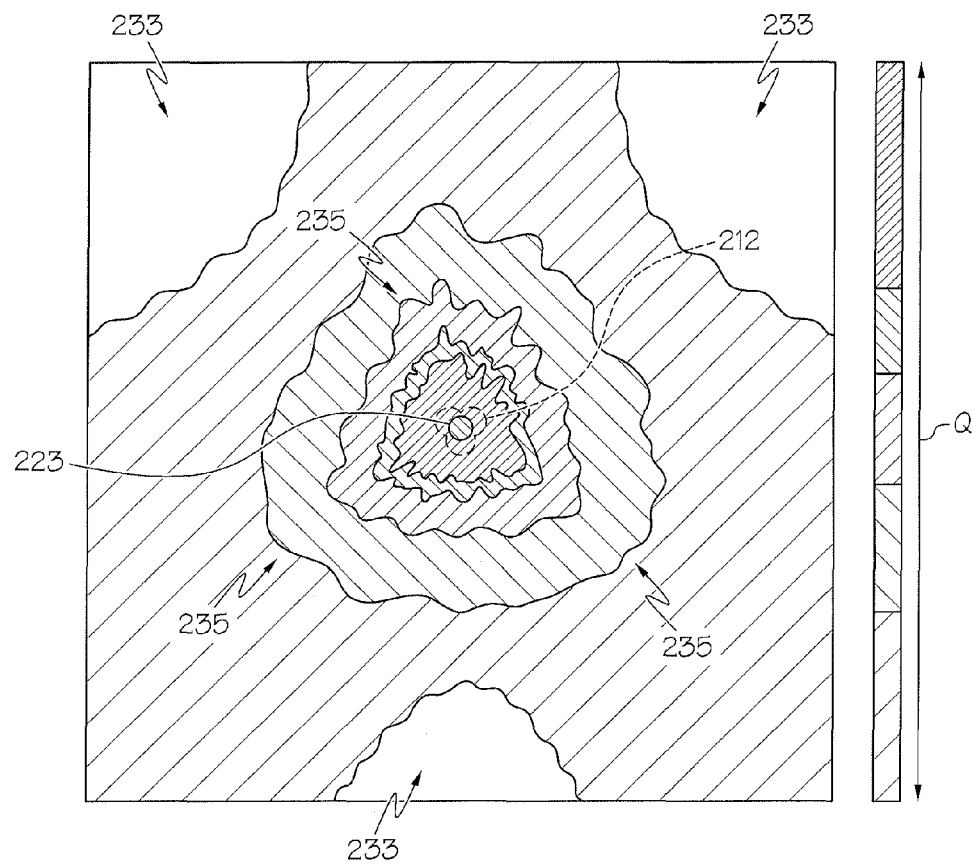
FIG. 6 schematically depicts a flow pattern of coolant fluid on a target surface corresponding to the jet orifice depicted in FIG. 5 according to one or more embodiments described and illustrated herein.

There are many possible jet orifice geometries and, therefore, many possible flow patterns. As another non-limiting example, FIGS. 5 and 6 depict a jet orifice 212 having a tri-lobed geometry and a resulting computationally derived flow pattern, respectively. The location of the jet orifice 212 with respect to the target surface is depicted in FIG. 6 by dashed lines for illustrative purposes. The flow pattern of FIG. 6 is represented by fluid flow velocity contours. The jet orifice 212 has three overlapping, circular lobes. Such a geometry may produce a desirable flow pattern to effectively cool a semiconductor device and target layer having a particular temperature profile.

As shown in FIG. 6, the velocity of the fluid is highest surrounding the impingement region 223, thereby providing a region of high fluid velocity. The velocity of the coolant fluid then decreases outwardly from impingement region 233. The flow of coolant fluid significantly slows or stops at the regions of low fluid velocity 233. Accordingly, the flow pattern resulting from the jet orifice 212 depicted in FIG. 5 has regions of high and low fluid velocity. The flow pattern of FIG. 6 is different from the flow pattern of FIG. 3 associated with the cross-shaped jet orifice 112 because of the difference in jet orifice geometry.

Figure 7:
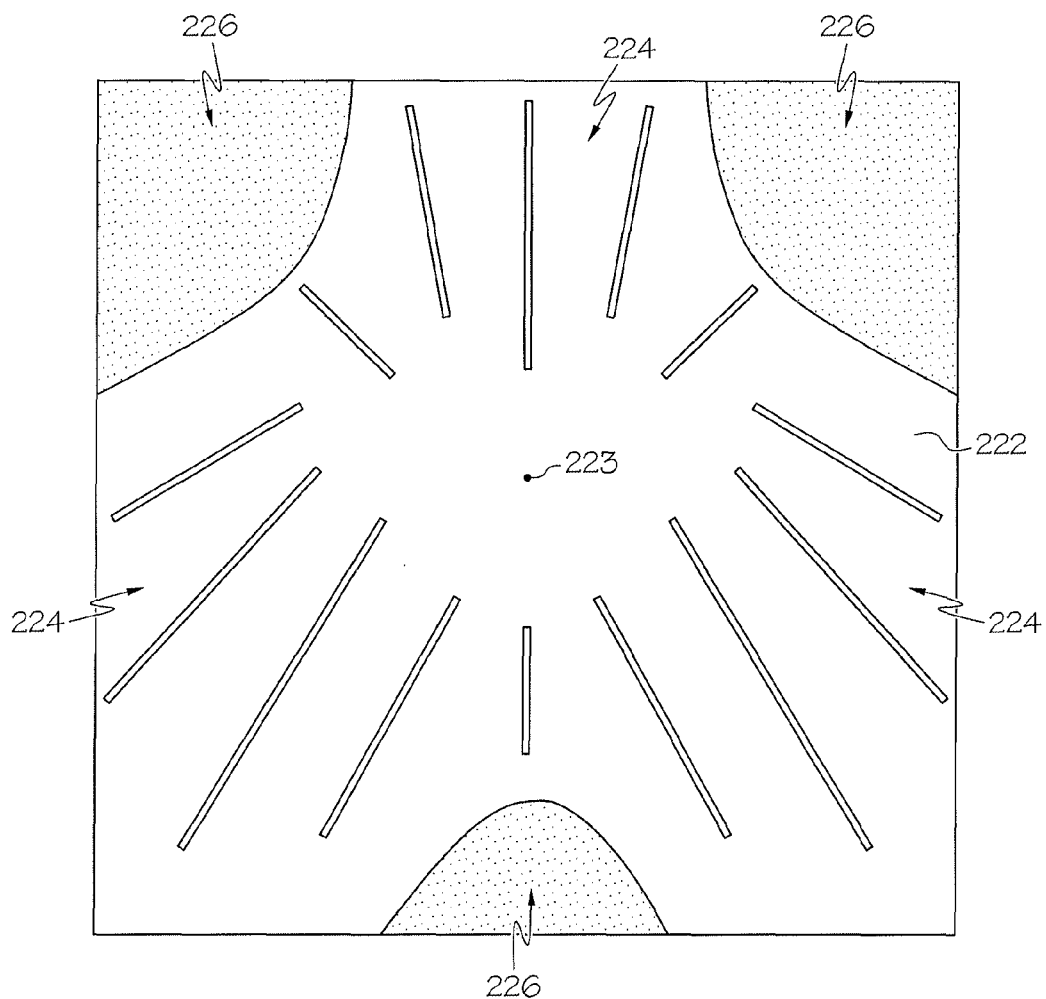
FIG. 7 schematically depicts a target surface having single-phase surface enhancement features and two-phase surface enhancement features arranged according to the flow pattern depicted in FIG. 6 according to one or more embodiments described and illustrated herein.

Referring now to FIG. 7, an exemplary target surface 222 corresponding to the flow pattern depicted in FIG. 6 is schematically illustrated. It should be understood that embodiments are not limited to the target surface 222 and corresponding single-phase and two-phase surface enhancement features depicted in FIG. 7. As described above with respect to FIG. 6, single-phase surface enhancement features 224 configured as thermally conductive fins are provided on the target surface 222 in the region of high fluid velocity 235. The thermally conductive fins may be integral to the target surface 222 of the target layer, or discrete components that are bonded or otherwise coupled to the target surface 222. The single-phase surface enhancement features 224 increase the surface area of the target surface 222 that the coolant fluid is in contact with, thereby enhancing thermal transfer from the target surface 222 to the coolant fluid by convection. In the illustrated embodiment, the single-phase surface enhancement features 224 are symmetrical about a single axis. More or fewer single-phase surface enhancement features 224 may be present on the target surface 222.

Similarly, the two-phase surface enhancement features 226 are arranged at the regions of low fluid velocity 233 of the coolant fluid as shown in FIG. 6. In the illustrated embodiment, there are three areas of two-phase surface enhancement features 226 that correspond with the three regions of low fluid velocity 233 of the flow pattern. As described above with reference to FIG. 4, the two-phase surface enhancement features 226 may be any micro- or nano-scale features that act as nucleation site enhancements to promote nucleation of the coolant fluid.

Because the outflow of the coolant fluid is not strong in the regions of low fluid velocity 233, nucleate boiling occurs at these areas of the target surface 222. The two-phase surface enhancement features 226 are configured such that nucleate boiling is enhanced compared to a smoother surface. In this manner, two-phase heat transfer is promoted at the regions of low fluid velocity 233 by the two-phase surface enhancement features 226. In some embodiments, two-phase surface enhancement features may also be provided at the impingement region 223 because the heat flux being removed from the target layer 220 may be highest at the impingement region 223. For example, two phase surface enhancement features may be provided on the target surface 222 in the central area surrounded by the single-phase surface enhancement features 224. In this manner, the embodiment depicted in FIG. 7 encourages both single- and two-phase heat transfer on a single surface by the use of surface enhancement features.

It should now be understood that embodiments described herein are directed to jet impingement, two-phase cooling assemblies and power electronics modules having a jet orifice with a shape tailored to a temperature profile of a target layer, and a target surface having single-phase surface enhancement features and two-phase surface enhancement features that are arranged corresponding to a flow pattern of coolant fluid produced by the jet orifice. The single-phase surface enhancement features are located on the target surface in regions of high fluid velocity to promote single-phase heat transfer to the coolant fluid, while the two-phase surface enhancement features are located on the target surface in regions of low fluid velocity to encourage nucleation and two-phase heat transfer.

While particular embodiments have been illustrated and described herein, it should be understood that various other changes and modifications may be made without departing from the spirit and scope of the claimed subject matter. Moreover, although various aspects of the claimed subject matter have been described herein, such aspects need not be utilized in combination. It is therefore intended that the appended claims cover all such changes and modifications that are within the scope of the claimed subject matter.

What is claimed is:

1. A cooling apparatus comprising:
  a jet channel;
  a jet plate surface comprising a jet orifice having a jet orifice geometry, wherein the jet orifice is in fluid communication with the jet channel and is configured to generate an impingement jet of a coolant fluid; and
  a target layer comprising a target surface, single-phase surface enhancement features, and two-phase surface enhancement features, wherein:
    the target surface is configured to receive the impingement jet at an impingement region;
    the single-phase surface enhancement features are positioned on the target surface at high fluid velocity regions; and
    the two-phase surface enhancement features are positioned on the target surface at low fluid velocity regions.

2. The cooling apparatus of claim 1, wherein the two-phase surface enhancement features comprise micro- and/or nano-features.

3. The cooling apparatus of claim 2, wherein the micro- and/or nano-features are pillars.

4. The cooling apparatus of claim 1, wherein the two-phase surface enhancement features are defined by roughened portions of the target surface.

5. The cooling apparatus of claim 4, wherein the roughened portions are laser roughened, chemically roughened, or mechanically roughened.

6. The cooling apparatus of claim 1, wherein the two-phase surface enhancement features comprise a film applied to the target surface.

7. The cooling apparatus of claim 6, wherein the film comprises micro- and/or nano-features.

8. The cooling apparatus of claim 1, wherein:
the jet orifice is cross-shaped;
the single-phase surface enhancement features are arranged in four groups of single-phase surface enhancement features;
the two-phase surface enhancement features are arranged in four regions of two-phase surface enhancement features; and
the four groups of single-phase surface enhancement features and the four regions of two-phase enhancement features alternate about the impingement region of the target surface.

9. The cooling apparatus of claim 8, wherein the four regions of two-phase enhancement features are arranged at a perimeter of the target surface.

10. The cooling apparatus of claim 8, wherein:
the four groups of single-phase surface enhancement features radially extend from the impingement region; and
individual groups of the four groups of single-phase surface enhancement features are arranged at ninety degrees with respect to adjacent groups of single-phase surface enhancement features.

11. The cooling apparatus of claim 10, wherein each group of single-phase surface enhancement features comprise a plurality of thermally conductive fins.

12. The cooling apparatus of claim 11, wherein:
the plurality of thermally conductive fins comprises a center thermally conductive fin; and
a length of individual thermally conductive fins decrease in directions away from the center thermally conductive fin.

13. The cooling apparatus of claim 1, wherein:
the jet orifice has three circular lobes;
the single-phase surface enhancement features are configured as a plurality of radially extending, thermally conductive fins; and
the two-phase surface enhancement features are arranged in three regions of two-phase surface enhancement features.

14. The cooling apparatus of claim 13, wherein the three regions of two-phase surface enhancement features are arranged at a perimeter of the target surface.

15. The cooling apparatus of claim 13, wherein:
a first region and a second region of the three regions of two-phase surface enhancement features are positioned at a first corner and a second corner of the target surface, respectively; and
a third region of the three regions of two-phase surface enhancement features is positioned proximate an edge of the target surface opposite from the first corner and the second corner.

16. The cooling apparatus of claim 13, wherein the single-phase surface enhancement features and the two-phase surface enhancement features are symmetrical about one axis.

17. The cooling apparatus of claim 1, further comprising an intermediate substrate assembly thermally coupled to a heat transfer surface of the target layer.

18. The cooling apparatus of claim 17, wherein the intermediate substrate layer comprises a directed bonded substrate assembly.

19. A power electronics module comprising:
a jet channel;
a jet plate surface comprising a jet orifice having a jet orifice geometry, wherein the jet orifice is in fluid communication with the jet channel and is configured to generate an impingement jet of a coolant fluid;
a target layer comprising a target surface, single-phase surface enhancement features, and two-phase surface enhancement features, wherein:
the target surface is configured to receive the impingement jet at an impingement region;
the single-phase surface enhancement features are positioned on the target surface at high fluid velocity regions; and
the two-phase surface enhancement features are positioned on the target surface at low fluid velocity regions; and
a semiconductor device thermally coupled to the heat transfer surface.

20. A vehicle comprising a power electronics module, the power electronics module comprising:
a jet channel;
a jet plate surface comprising a jet orifice having a jet orifice geometry, wherein the jet orifice is in fluid communication with the jet channel and is configured to generate an impingement jet of a coolant fluid;
a target layer comprising a target surface, single-phase surface enhancement features, and two-phase surface enhancement features, wherein:
the target surface is configured to receive the impingement jet at an impingement region;
the single-phase surface enhancement features are positioned on the target surface at high fluid velocity regions; and
the two-phase surface enhancement features are positioned on the target surface at low fluid velocity regions; and
a semiconductor device thermally coupled to the heat transfer surface.

* * * * *